US009564185B1

(12) United States Patent
Yanagidaira

(10) Patent No.: US 9,564,185 B1
(45) Date of Patent: Feb. 7, 2017

(54) SEMICONDUCTOR MEMORY DEVICE

(71) Applicant: Kabushiki Kaisha Toshiba, Minato-ku (JP)

(72) Inventor: Kosuke Yanagidaira, Fujisawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/000,433

(22) Filed: Jan. 19, 2016

Related U.S. Application Data

(60) Provisional application No. 62/216,767, filed on Sep. 10, 2015.

(51) Int. Cl.
G11C 7/00 (2006.01)
G11C 7/10 (2006.01)
G11C 7/22 (2006.01)
G11C 8/06 (2006.01)
G11C 7/12 (2006.01)
G11C 8/18 (2006.01)

(52) U.S. Cl.
CPC . G11C 7/10 (2013.01); G11C 7/12 (2013.01); G11C 7/22 (2013.01); G11C 8/06 (2013.01); G11C 8/18 (2013.01)

(58) Field of Classification Search
CPC ............... G11C 7/10; G11C 7/12; G11C 7/22; G11C 8/06; G11C 8/10; G11C 8/18
USPC ............ 365/189.17, 189.05, 230.06, 230.08, 365/233.1; 327/77, 108, 109; 326/30, 21
See application file for complete search history.

(56) References Cited

U.S. PATENT DOCUMENTS

| | | | |
|---|---|---|---|
| 6,853,213 B2* | 2/2005 | Funaba | H03K 19/018592 326/21 |
| 7,038,498 B2* | 5/2006 | Funaba | H03K 19/018592 326/30 |
| 7,881,150 B2* | 2/2011 | Solomon | G06F 12/0207 365/149 |
| 8,391,088 B2 | 3/2013 | Sohn et al. | |
| 8,988,101 B2* | 3/2015 | Song | G11C 7/1057 326/30 |
| 2008/0079458 A1 | 4/2008 | Shin et al. | |
| 2011/0205832 A1* | 8/2011 | Jeon | G11C 7/1057 365/233.16 |

* cited by examiner

Primary Examiner — Gene Auduong
(74) Attorney, Agent, or Firm — Oblon, McClelland, Maier & Neustadt, L.L.P.

(57) ABSTRACT

According to one embodiment, a semiconductor memory device includes a memory including a memory cell array, and an input/output pin configured to transfer data, a command, and an address from an external to the memory. The memory includes a termination circuit provided between the input/output pin and the memory cell array, and configured to supply a first voltage having a first amplitude in a first transfer mode and supply a second voltage having a second amplitude in a second transfer mode, a first intermediate value of the first amplitude being different from a second intermediate value of the second amplitude.

18 Claims, 15 Drawing Sheets

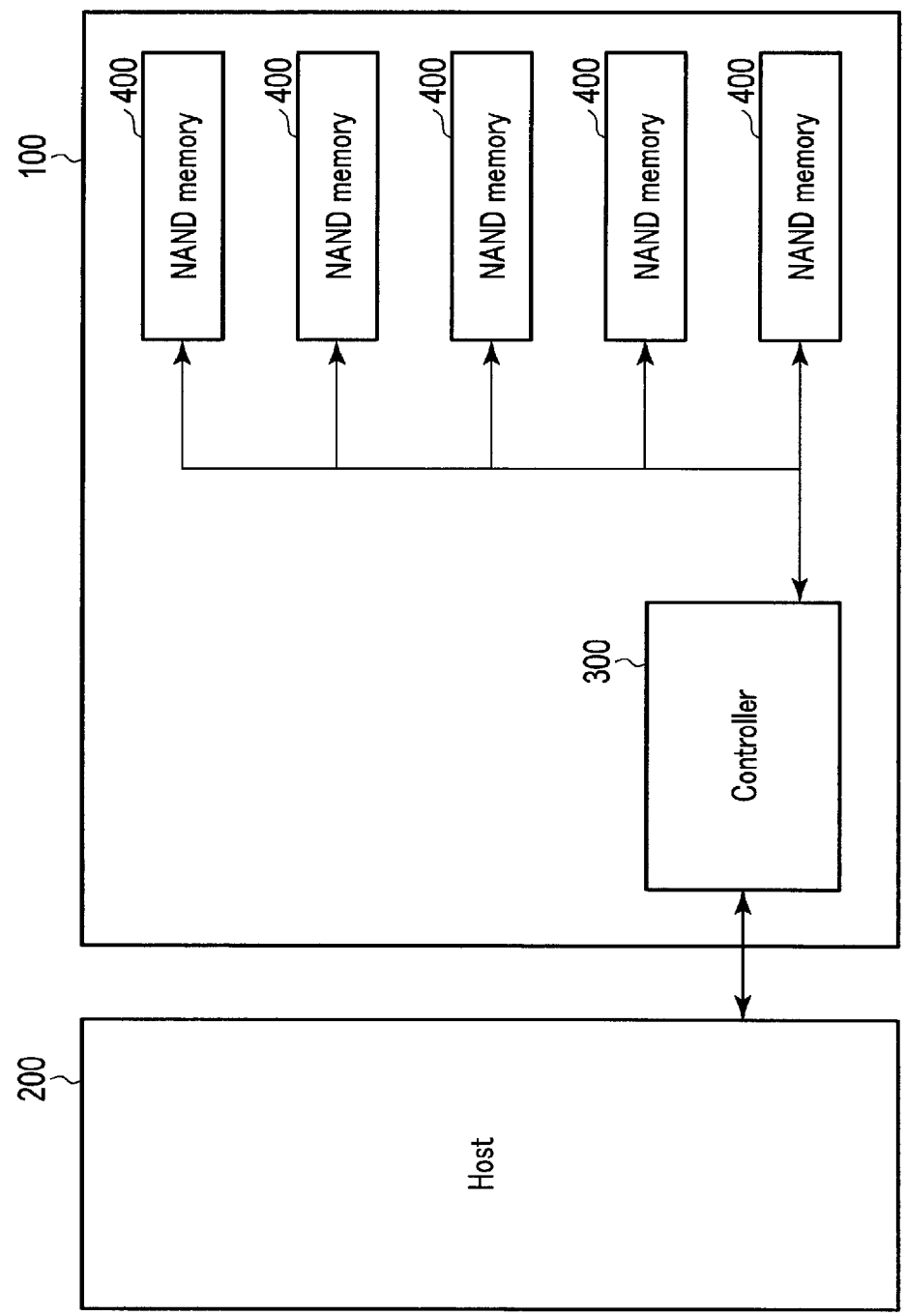
F I G. 1

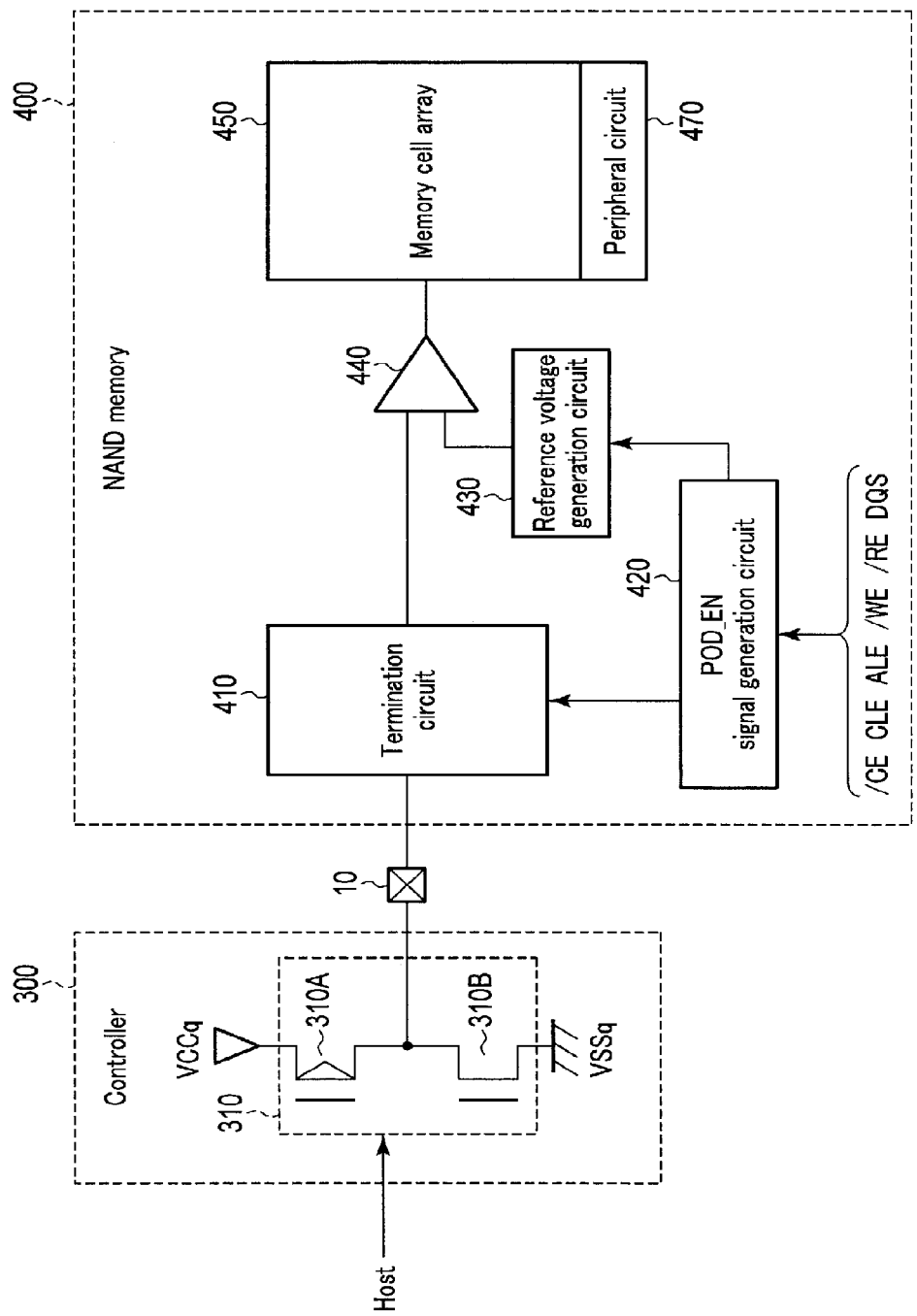
F I G. 2

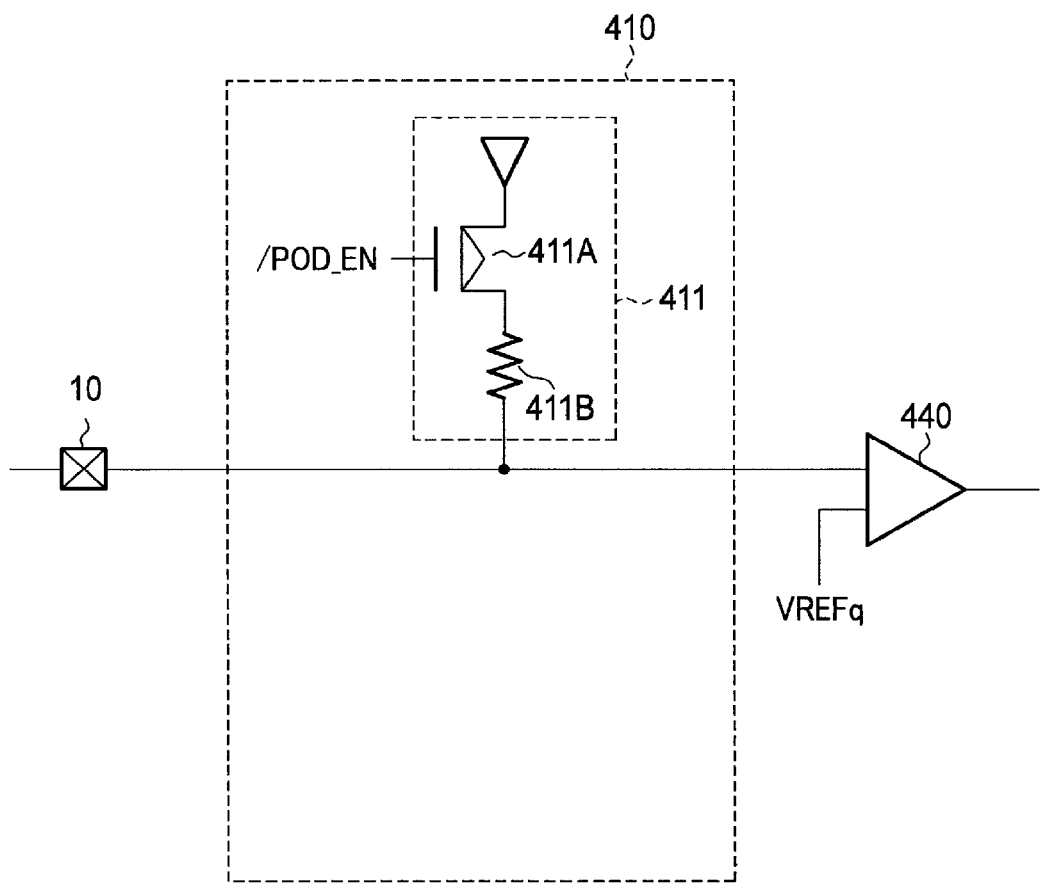
F I G. 3

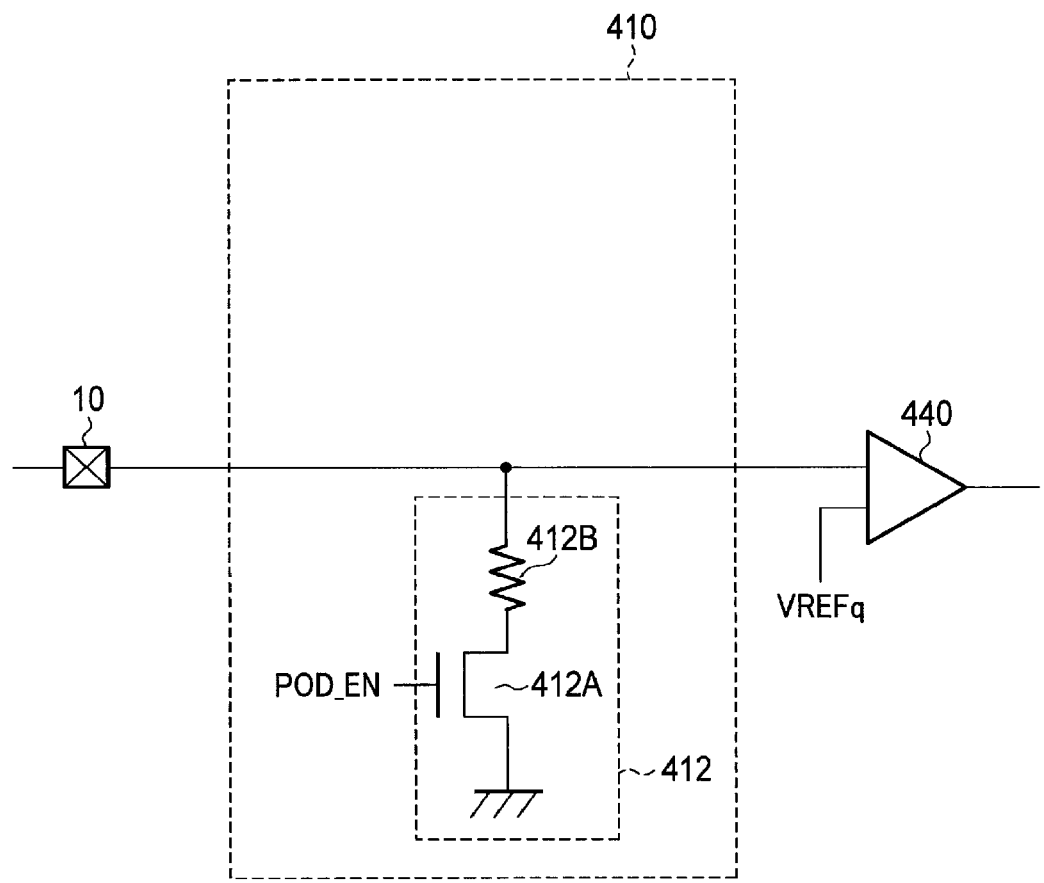
F I G. 6

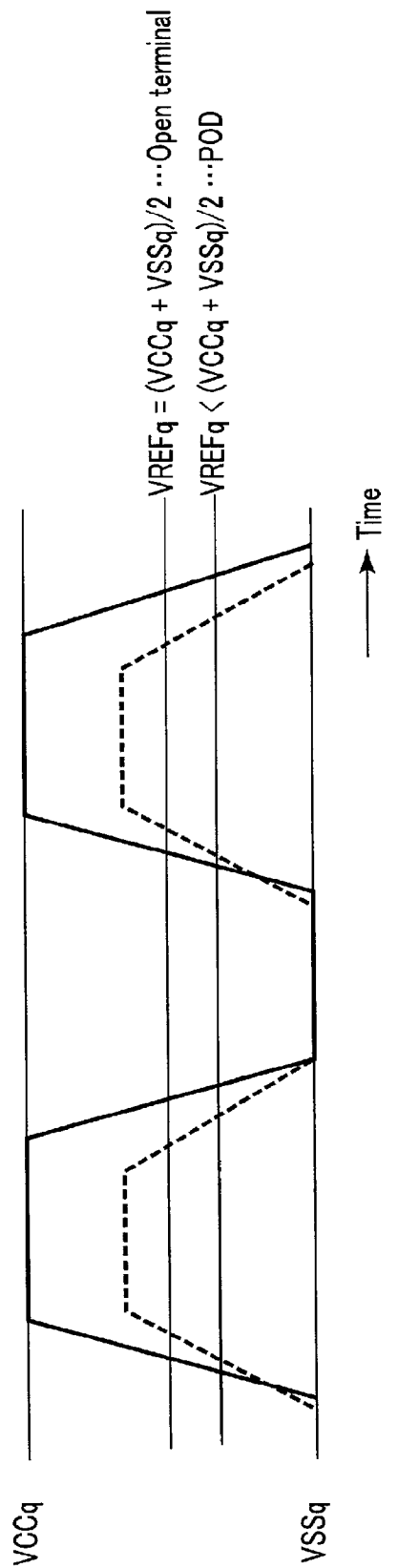
F I G. 7

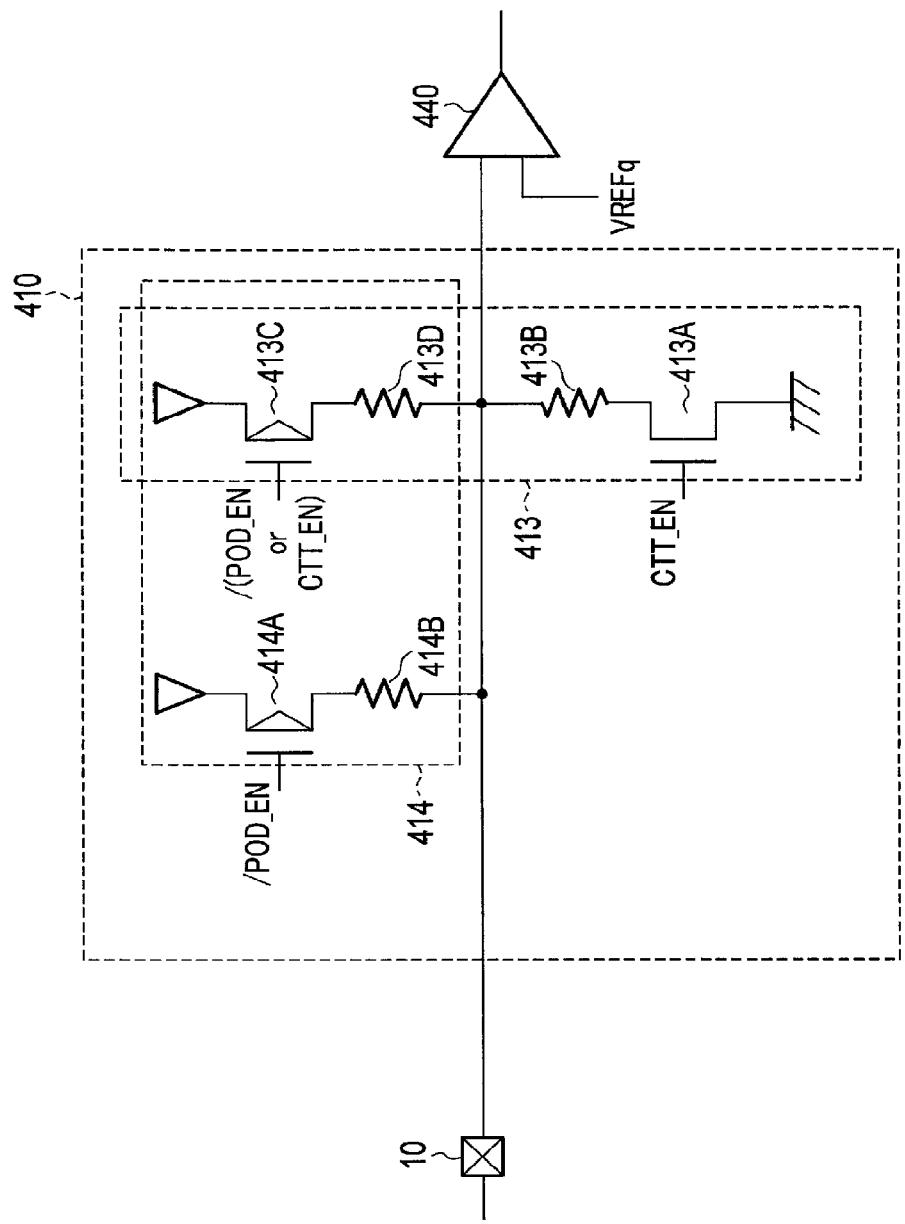
F I G. 10

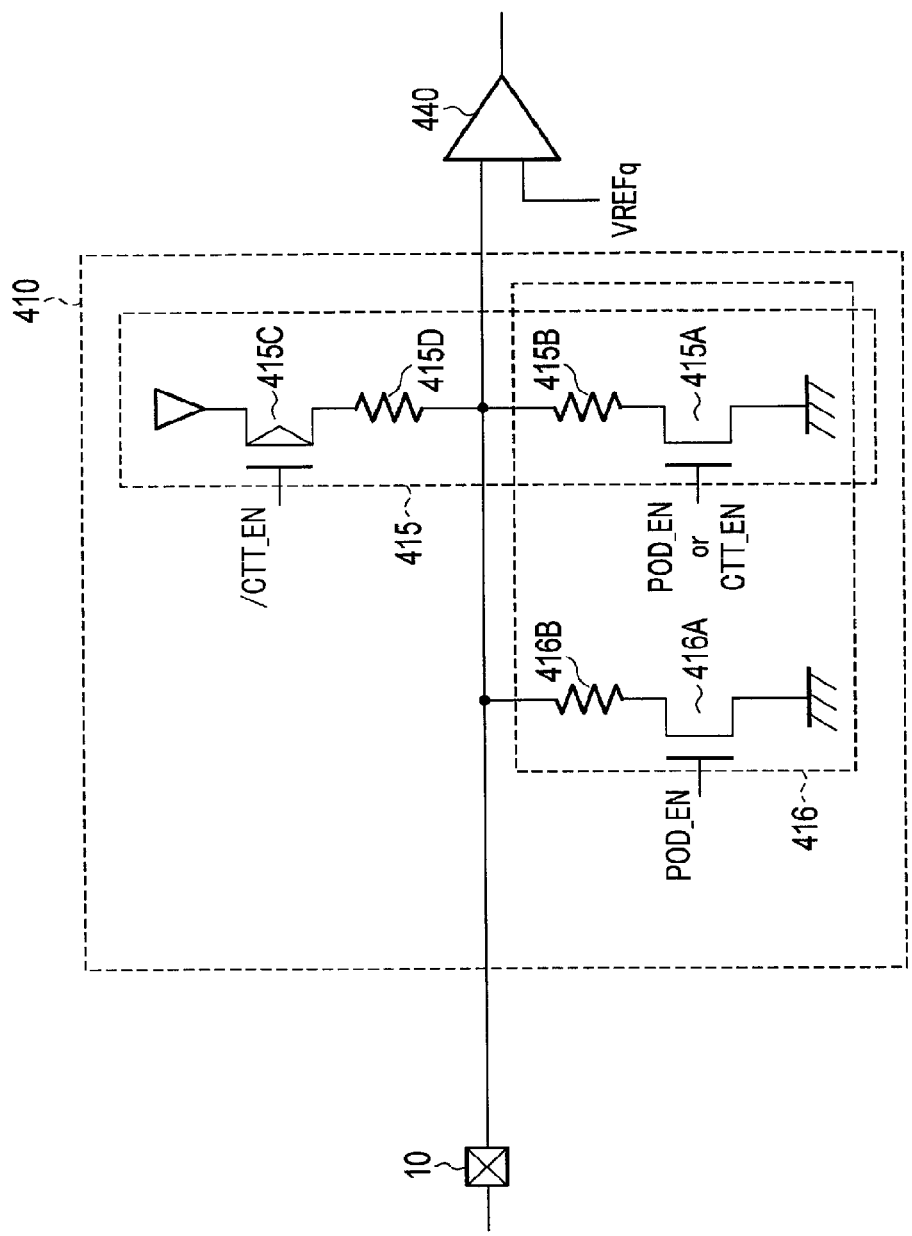
F I G. 13

SEMICONDUCTOR MEMORY DEVICE

FIELD

Embodiments described herein relate generally to a semiconductor memory device.

CROSS REFERENCE TO RELATED APPLICATIONS

This application is based upon and claims the benefit of priority from U.S. Provisional Application No. 62/216,767, filed Sep. 10, 2015, the entire contents of all of which are incorporated herein by reference.

BACKGROUND

The I/O interface of a NAND memory includes a common input/output pin for transferring data, commands, and addresses. When transferring data, commands, and addresses via the input/output pin, a POD (Pseudo Open Drain) system or CTT (Center Tapped Termination) system is used as a termination circuit to increase the operating speed. In the POD system, an output signal (output voltage) from the input/output pin is terminated to one of a power supply voltage VCCq and a ground voltage VSSq. On the other hand, in the CTT system, an output signal from the input/output pin is terminated to both the power supply voltage VCCq and the ground voltage VSSq.

BRIEF DESCRIPTION OF THE DRAWINGS

FIG. 1 is a block diagram showing a semiconductor memory device according to the first embodiment;

FIG. 2 is a block diagram showing a controller and NAND memory in the semiconductor memory device according to the first embodiment;

FIG. 3 is a circuit diagram showing a termination circuit in the semiconductor memory device according to the first embodiment;

FIG. 6 is a circuit diagram showing a termination circuit in a semiconductor memory device according to the second embodiment;

FIG. 7 is a waveform chart showing a voltage supplied by the termination circuit in the semiconductor memory device according to the second embodiment;

FIG. 10 is a circuit diagram showing a termination circuit in the semiconductor memory device according to the third embodiment;

FIG. 13 is a circuit diagram showing a termination circuit in a semiconductor memory device according to the fourth embodiment;

DETAILED DESCRIPTION

Figure 4:
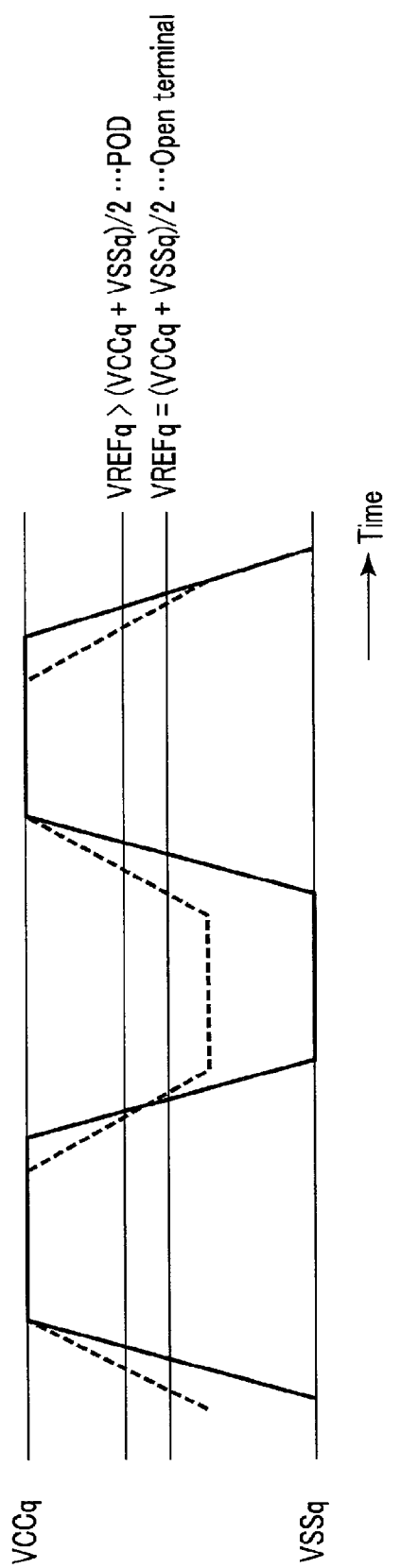
FIG. 4 is a waveform chart showing a voltage supplied by the termination circuit in the semiconductor memory device according to the first embodiment.

In general, according to one embodiment, a semiconductor memory device includes a memory including a memory cell array, and an input/output pin configured to transfer data, a command, and an address from an external to the memory. The memory includes a termination circuit provided between the input/output pin and the memory cell array, and configured to supply a first voltage having a first amplitude in a first transfer mode and supply a second voltage having a second amplitude in a second transfer mode, a first intermediate value of the first amplitude being different from a second intermediate value of the second amplitude.

Embodiments will be described below with reference to the accompanying drawings. The same reference numerals denote the same parts throughout the drawings.

First Embodiment

A semiconductor memory device according to the first embodiment will be described with reference to FIGS. 1, 2, 3, 4, and 5.

In the first embodiment, a POD enable signal generation circuit 420 is provided. A termination circuit 410 serves as the POD system when transferring data, and serves as an open terminal when transferring commands and addresses. This can perform a transfer operation at high speed while reducing the power consumption in transferring commands and addresses and suppressing an increase in power consumption in transferring data. The first embodiment will be described in detail below.

[Example of Overall Arrangement of First Embodiment]

FIG. 1 is a block diagram showing a semiconductor memory device 100 according to the first embodiment. In the following description, "connection" includes not only direct connection but also connection via an arbitrary element.

As shown in FIG. 1, the semiconductor memory device 100 includes a controller 300 and NAND memories 400.

The controller 300 controls the NAND memories 400 based on, for example, data (user data and the like), commands, and addresses from a host 200. The controller 300 is electrically connected to the NAND memories 400 via an input/output pin 10 (to be described alter). The controller 300 transfers the data, commands, and addresses from the host 200 to the NAND memories 400 via the input/output pin 10.

Note that arbitrary nonvolatile semiconductor memories may be arranged in place of the NAND memories 400. In addition, although the five NAND memories 400 are arranged in FIG. 1, the present invention is not limited to this and the number of NAND memories can be changed, as needed.

[Examples of Arrangements of Controller and NAND Memory of First Embodiment]

FIG. 2 is a block diagram showing the controller 300 and NAND memory 400 in the semiconductor memory device 100 according to the first embodiment. FIG. 3 is a circuit diagram showing the termination circuit 410 in the semiconductor memory device 100 according to the first embodiment. FIG. 4 is a waveform chart showing a voltage supplied by the termination circuit 410 in the semiconductor memory device 100 according to the first embodiment.

In the following description, the first terminal of a transistor indicates one of a source and drain, and the second terminal of the transistor indicates the other of the source and drain. Furthermore, the control terminal of the transistor indicates a gate.

As shown in FIG. 2, the controller 300 and the NAND memory 400 are electrically connected via the input/output pin 10.

The controller 300 includes an output buffer 310. The output buffer 310 includes a PMOS transistor 310A and an NMOS transistor 310B. The PMOS transistor 310A has the first terminal electrically connected to a power supply voltage VCCq and the second terminal electrically connected to the first terminal of the NMOS transistor 310B. The second terminal of the NMOS transistor 310E is electrically connected to a ground voltage VSSq. The control terminal of the PMOS transistor 310A and that of the NMOS transistor 310B are supplied with a signal based on the data, commands, and addresses from the host 200. In accordance with the signal from the host 200, the output buffer 310 supplies a voltage at "H" level (VCCq) or "L" level (VSSq) to the input/output pin 10. The input/output pin 10 supplies the voltage from the output buffer 310 to the NAND memory 400 (termination circuit 410).

The NAND memory 400 includes the termination circuit 410, the POD enable signal generation circuit 420, a reference voltage generation circuit 430, an input buffer 440, a memory cell array 450, and a peripheral circuit 470.

The memory cell array 450 includes a plurality of memory cells for storing data. The plurality of memory cells are arranged in a matrix. The peripheral circuit 470 controls the memory cell array 450 in accordance with various commands and addresses. The peripheral circuit 470 includes, for example, a row decoder, column decoder, and various drivers.

The POD enable signal generation circuit 420 generates a POD enable signal POD_EN in accordance with a chip enable inverted signal /CE, command latch enable signal CLE, address latch enable signal ALE, write enable inverted signal /WE, read enable inverted signal /RE, and data strobe signal DQS. The POD enable signal generation circuit 420 supplies the POD enable signal POD_EN to the termination circuit 410 and the reference voltage generation circuit 430.

The termination circuit 410 switches a termination system in accordance with the POD enable signal POD_EN from the POD enable signal generation circuit 420. Then, the termination circuit 410 adjusts a voltage from the input/output pin 10 in accordance with the termination system, and supplies it to the first input terminal of the input buffer 440.

More specifically, as shown in FIG. 3, the termination circuit 410 includes a POD circuit 411. The POD circuit 411 includes a PMOS transistor 411A and a resistor 411B. The PMOS transistor 411A has the first terminal electrically connected to the power supply voltage VCCq and the second terminal electrically connected to the first terminal of the resistor 411B. The second terminal of the resistor 411B is electrically connected to the input/output pin 10 and the first input terminal of the input buffer 440. A POD enable inverted signal /POD_EN is supplied from the POD enable signal generation circuit 420 to the control terminal of the PMOS transistor 411A.

When the termination circuit 410 functions as the POD system, the POD enable inverted signal /POD_EN at "L" level is supplied to the control terminal of the PMOS transistor 411A. This turns on the PMOS transistor 411A. The on resistance of the PMOS transistor 411A and the resistor 411B raise the voltage VSSq from the input/output pin 10 to a voltage VSSq+α. That is, as indicated by a broken line in FIG. 4, the termination circuit 410 adjusts the voltage amplitude from the input/output pin 10 within the range from the voltage VSSq+α to the voltage VCCq by the load resistance of the on resistance of the PMOS transistor 411A and the resistor 411B. Consequently, the termination circuit 410 supplies, to the first input terminal of the input buffer 440, a voltage having an amplitude of the voltage VSSq+α to the voltage VCCq.

When the termination circuit 410 functions as the open terminal, the POD enable inverted signal /POD_EN at "H" level is supplied to the control terminal of the PMOS transistor 411A. This turns off the PMOS transistor 411A. That is, as indicated by a solid line in FIG. 4, the termination circuit 410 does not adjust the voltage amplitude from the input/output pin 10. Consequently, the termination circuit 410 supplies, to the first input terminal of the input buffer 440, a voltage having an amplitude of the voltage VSSq to the voltage VCCq.

In accordance with the POD enable signal POD_EN from the POD enable signal generation circuit 420, the reference voltage generation circuit 430 generates a reference voltage VREFq. The reference voltage generation circuit 430 supplies the reference voltage VREFq to the second input terminal of the input buffer 440.

More specifically, as shown in FIG. 4, when the termination circuit 410 functions as the POD system, the reference voltage generation circuit 430 supplies the reference voltage VREFq (>(VCCq+VSSq)/2) as an intermediate value between the voltage VSSq+α and the voltage VCCq. On the other hand, when the termination circuit 410 functions as the open terminal, the reference voltage generation circuit 430 supplies the reference voltage VREFq (=(VCCq+VSSq)/2) as an intermediate value between the voltage VSSq and the voltage VCCq.

Note that in accordance with the POD enable signal POD_EN, the reference voltage generation circuit 430 may generate a plurality of kinds of reference voltages VREFq by itself and supply them, or select a plurality of kinds of reference voltages VREFq externally supplied and supply them.

The input buffer 440 compares the voltage of the first input terminal (the voltage from the termination circuit 410) with the voltage of the second input terminal (the reference voltage VREFq from the reference voltage generation circuit 430). The input buffer 440 supplies a voltage corresponding to the comparison result to the memory cell array 450 and the peripheral circuit 470.

[Examples of Operations of Controller and NAND Memory of First Embodiment]

Figure 5:
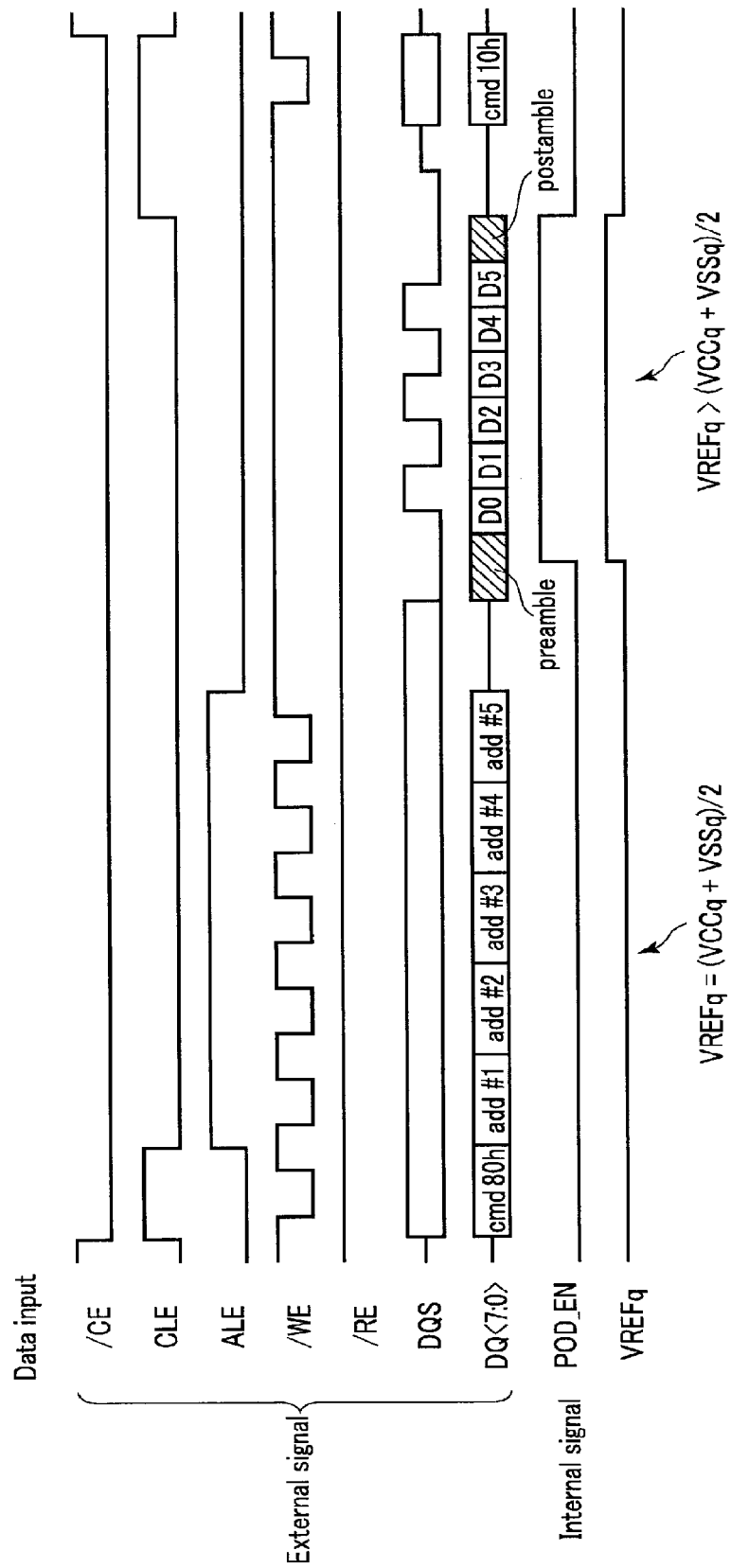
FIG. 5 is a timing chart showing various signals in the semiconductor memory device according to the first embodiment.

FIG. 5 is a timing chart showing various signals in the semiconductor memory device 100 according to the first embodiment. Referring to FIG. 5, the chip enable inverted signal /CE, the command latch enable signal CLE, the address latch enable signal ALE, the write enable inverted signal /WE, the read enable inverted signal /RE, the data strobe signal DQS, and data DQ are external signals supplied from the controller 300 to the NAND memory 400. Furthermore, the POD enable signal POD_EN is an internal signal generated in the NAND memory 400.

As shown in FIG. 5, the chip enable inverted signal /CE is set at "L" level to select a chip. In addition, the command latch enable signal CLE is set at "H" level. During this time, the write enable inverted signal /WE is used as a clock to transfer a command cmd80h (for example, a write command) from the controller 300 to the NAND memory 400.

Subsequently, the command latch enable signal CLE is set at "L" level, and the address latch enable signal ALE is set at "H" level. During this time, the write enable inverted signal /WE is used as a clock to transfer addresses add#1 to add#5 from the controller 300 to the NAND memory 400.

During this time, the data strobe signal DQS is set at "H" or "L" level. In addition, the read enable inverted signal /RE is set at "H" level.

When the command cmd80h and the addresses add#1 to add#5 are transferred to the NAND memory 400, the POD enable signal generation circuit 420 generates the POD enable signal POD_EN at "L" level (the POD enable inverted signal /POD_EN at "H" level). This turns off the PMOS transistor 411A in the termination circuit 410. That is, when the command cmd80h and the addresses add#1 to add#5 are transferred (in the first transfer mode), the termination circuit 410 functions as the open terminal. At this time, the reference voltage generation circuit 430 generates the reference voltage VREFq (=(VCCq+VSSq)/2).

Upon end of transfer of the addresses add#1 to add#5, the write enable inverted signal /WE is set at "H" level. After that, the address latch enable signal ALE is set at "L" level. In addition, the data strobe signal DQS is set at "L" level. This causes the controller 300 to issue a preamble and supply it to the NAND memory 400 before transferring data. After that, the data strobe signal DQS is used as a clock to transfer data D0 to D5 from the controller 300 to the NAND memory 400.

Note that in this example, a preamble is issued after the data strobe signal DQS changes from "H" level to "L" level. The present invention, however, is not limited to this. If the data strobe signal DQS is preset at "L" level, a preamble is issued after the address latch enable signal ALE changes from "H" level to "L" level.

The NAND memory 400 (POD enable signal generation circuit 420) sets the POD enable signal POD_EN at "H" level by using the preamble supply start point as a trigger. Therefore, when the data D0 to D5 are transferred to the NAND memory 400 (in the second transfer mode), the POD enable signal generation circuit 420 generates the POD enable signal POD_EN at "H" level (the POD enable inverted signal /POD_EN at "L" level). This turns on the PMOS transistor 411A in the termination circuit 410. That is, when the data D0 to D5 are transferred, the termination circuit 410 functions as the POD system. At this time, the reference voltage generation circuit 430 generates the reference voltage VREFq (>(VCCq+VSSq)/2).

After the data D0 to D5 are transferred, the controller 300 sequentially issues a postamble and supplies it to the NAND memory 400. After that, the command latch enable signal CLE is set at "H" level. This ends supply of the postamble. The NAND memory 400 (POD enable signal generation circuit 420) sets the POD enable signal POD_EN at "L" level by using the postamble supply end point as a trigger. After that, a command cmd10h (for example, execution command) is supplied to the NAND memory 400.

[Effects in First Embodiment]

In the first embodiment, the POD enable signal generation circuit 420 is provided. When transferring data, commands, and addresses from the controller 300 to the NAND memory 400, the termination system of the termination circuit 410 is switched in accordance with the POD enable signal POD_EN. More specifically, the termination circuit 410 serves as the POD system when transferring data, and serves as the open terminal when transferring commands and addresses. This can perform a transfer operation at high speed while reducing the power consumption in transferring commands and addresses and suppressing an increase in power consumption in transferring data.

In this case, the voltage amplitude of an output signal (output voltage) changes depending on whether the termination circuit 410 serves as the POD system or the open terminal. Especially, only one of "H" level (maximum value) and "L" level (minimum value) is different between the POD system and the open terminal. Therefore, an intermediate value (the intermediate value of the voltage amplitude) between "H" level and "L" level is different between the POD system and the open terminal. Since the reference voltage VREFq for identifying "H" level/"L" level is desirably the intermediate value of the voltage amplitude, it is impossible to set the same reference voltage VREFq for the POD system and open terminal which have the different intermediate values.

To cope with this, the reference voltage generation circuit 430 is provided in the first embodiment. The reference voltage generation circuit 430 generates the reference voltage VREFq, as needed, in accordance with the POD enable signal. This makes it possible to generate different reference voltages VREFq for the POD system and open terminal, thereby implementing the above-described switching of the termination system of the termination circuit 410.

Second Embodiment

A semiconductor memory device according to the second embodiment will be described with reference to FIGS. 6, 7, and 8.

In the first embodiment, the POD circuit 411 on the VCCq side is provided. To the contrary, the second embodiment is a modification of the first embodiment, in which a POD circuit 412 on the VSSq side is provided.

The second embodiment will be described in detail below. Note that in the second embodiment, a description of the same points as in the aforementioned first embodiment will be omitted, and different points will mainly be explained.

[Examples of Arrangements of Controller and NAND Memory of Second Embodiment]

FIG. 6 is a circuit diagram showing a termination circuit 410 in the semiconductor memory device according to the second embodiment. FIG. 7 is a waveform chart showing a voltage supplied by the termination circuit 410 in the semiconductor memory device according to the second embodiment. FIG. 8 is a timing chart showing various signals in a semiconductor memory device 100 according to the second embodiment.

As shown in FIG. 6, in the second embodiment, the difference from the first embodiment is that the POD circuit 412 on the VSSq side is provided.

More specifically, the termination circuit 410 includes the POD circuit 412. The POD circuit 412 includes an NMOS transistor 412A and a resistor 412B. The NMOS transistor 412A has the first terminal electrically connected to a ground voltage VSSq and the second terminal electrically connected to the first terminal of the resistor 412B. The second terminal of the resistor 412B is electrically connected to an input/output pin 10 and the first input terminal of an input buffer 440. A POD enable signal POD_EN is supplied from a POD enable signal generation circuit 420 to the control terminal of the NMOS transistor 412A.

When the termination circuit 410 functions as the POD system, the POD enable signal POD_EN at "H" level is supplied to the control terminal of the NMOS transistor 412A. This turns on the NMOS transistor 412A. The on resistance of the NMOS transistor 412A and the resistor 412B lower a voltage VCCq from the input/output pin 10 to a voltage VCCq-α. That is, as indicated by a broken line in FIG. 7, the termination circuit 410 adjusts the voltage amplitude from the input/output pin 10 within the range from the voltage VSSq to the voltage VCCq-α by the load resistance of the on resistance of the NMOS transistor 412A and the resistor 412B. Consequently, the termination circuit 410 supplies, to the first input terminal of the input buffer 440, a voltage having an amplitude of the voltage VSSq to the voltage VCCq-α.

When the termination circuit 410 functions as the open terminal, the POD enable signal POD_EN at "L" level is supplied to the control terminal of the NMOS transistor 412A. This turns off the NMOS transistor 412A. That is, as indicated by a solid line in FIG. 7, the termination circuit 410 does not adjust the voltage amplitude from the input/output pin 10. Consequently, the termination circuit 410 supplies, to the first input terminal of the input buffer 440, a voltage having an amplitude of the voltage VSSq to the voltage VCCq.

As shown in FIG. 7, when the termination circuit 410 functions as the POD system, a reference voltage generation circuit 430 supplies a reference voltage VREFq (<(VCCq+VSSq)/2) as an intermediate value between the voltage VSSq and the voltage VCCq-α.

Figure 8:
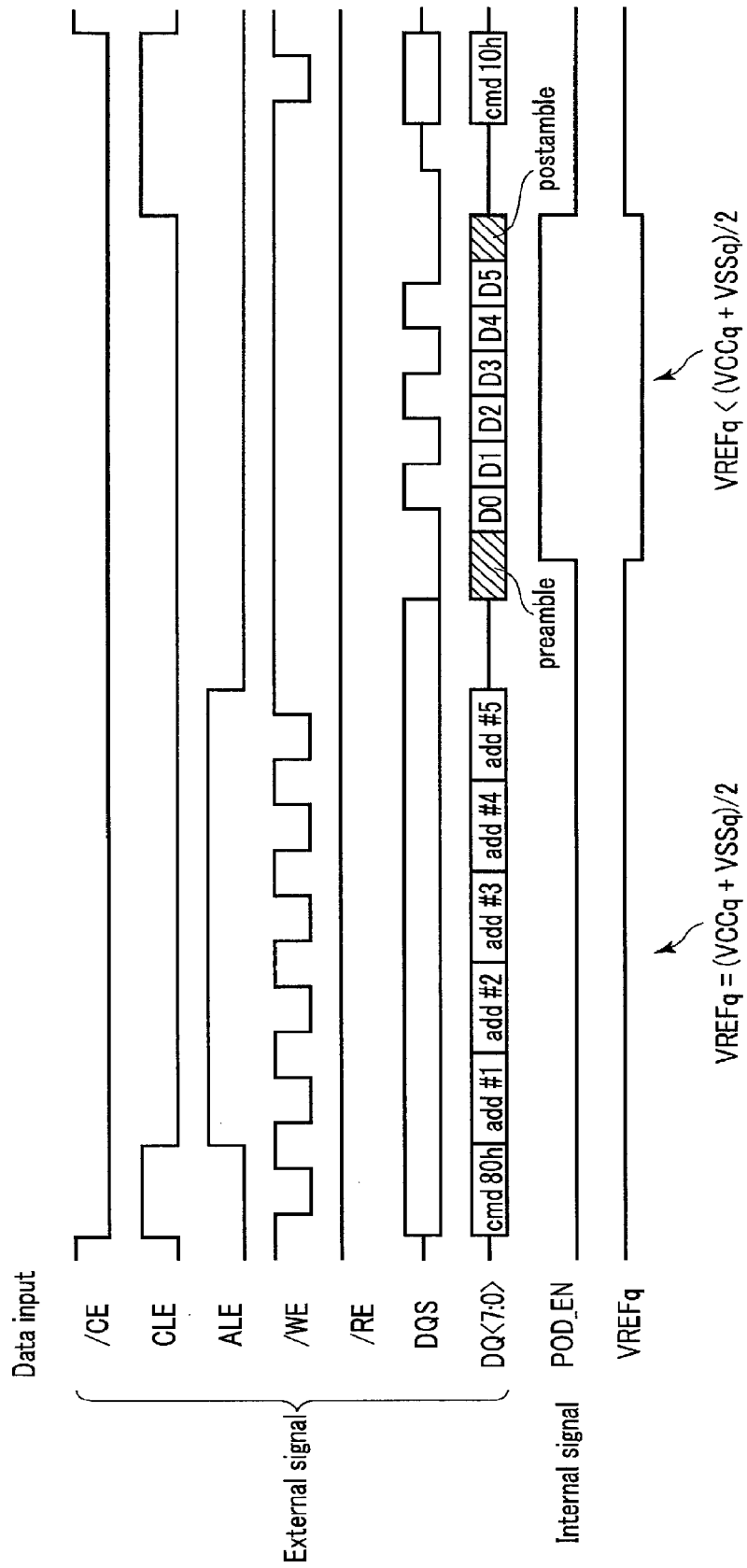
FIG. 8 is a timing chart showing various signals in the semiconductor memory device according to the second embodiment.

Furthermore, as shown in FIG. 8, when transferring data D0 to D5, the termination circuit 410 functions as the POD system. At this time, the reference voltage generation circuit 430 generates the reference voltage VREFq (<(VCCq+VSSq)/2).

[Effects in Second Embodiment]

In the aforementioned second embodiment, the termination circuit 410 includes the POD circuit 412 on the VSSq side. This makes it possible to obtain the same effects as in the first embodiment.

Third Embodiment

A semiconductor memory device according to the third embodiment will be described below with reference to FIGS. 9, 10, 11, and 12.

In the third embodiment, a POD enable signal generation circuit 420 and a CTT enable signal generation circuit 460 are provided. A termination circuit 410 serves as the POD system when transferring data, and serves as the CTT method when transferring commands and addresses. This can perform a transfer operation at high speed in transferring commands and addresses, and perform a transfer operation at high speed while suppressing an increase in power consumption in transferring data.

The third embodiment will be described in detail below. Note that in the third embodiment, a description of the same points as in the first embodiment will be omitted, and different points will mainly be explained.

[Examples of Arrangements of Controller and NAND Memory of Third Embodiment]

Figure 9:
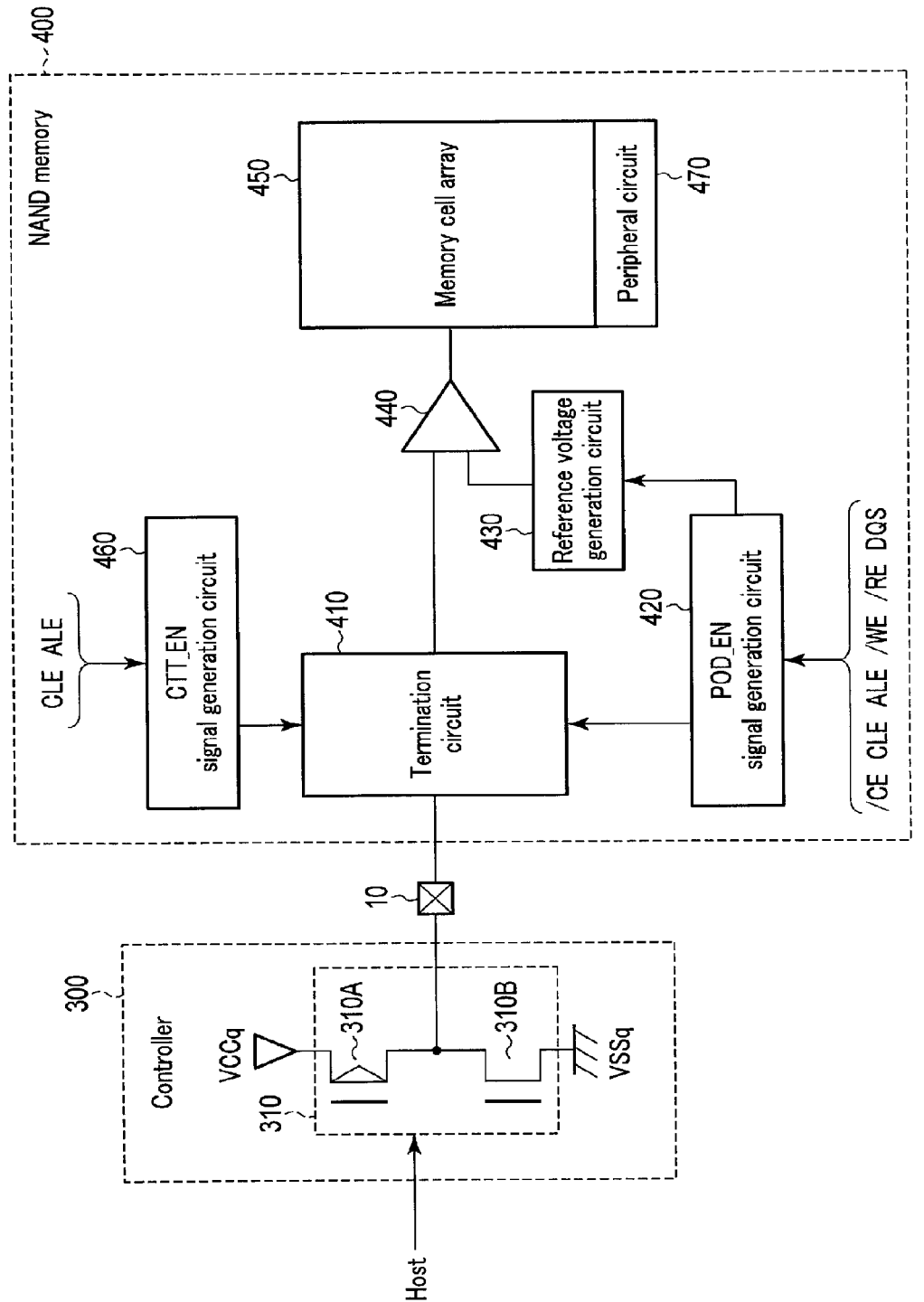
FIG. 9 is a block diagram showing a controller and NAND memory in a semiconductor memory device according to the third embodiment.
Figure 11:
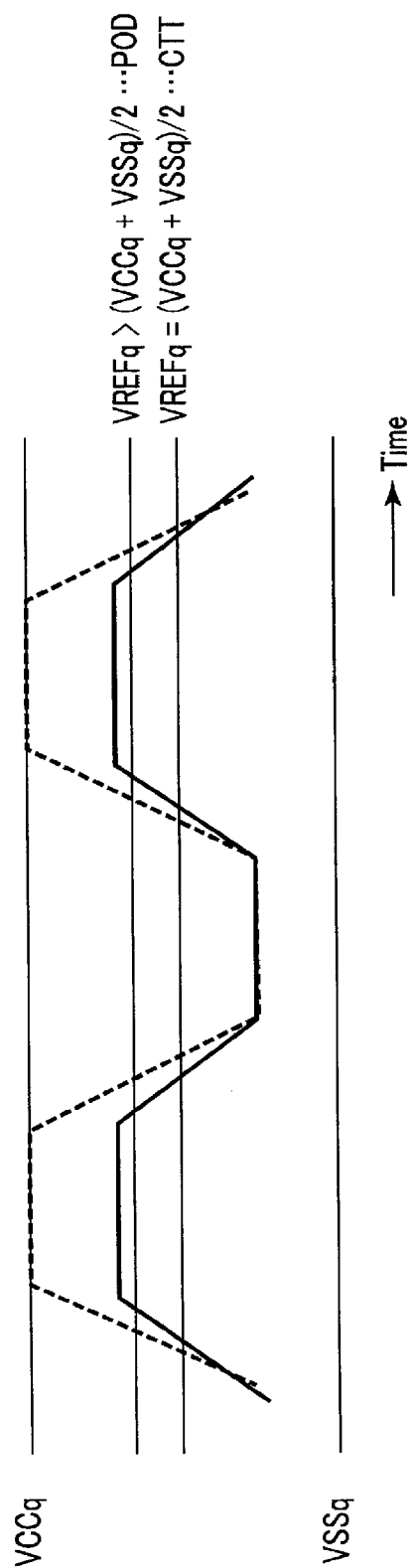
FIG. 11 is a waveform chart showing a voltage supplied by the termination circuit in the semiconductor memory device according to the third embodiment.

FIG. 9 is a block diagram showing a controller 300 and a NAND memory 400 in a semiconductor memory device 100 according to the third embodiment. FIG. 10 is a circuit diagram showing the termination circuit 410 in the semiconductor memory device according to the third embodiment. FIG. 11 is a waveform chart showing a voltage supplied by the termination circuit 410 in the semiconductor memory device according to the third embodiment.

As shown in FIG. 9, in the third embodiment, the difference from the first embodiment is that the NAND memory 400 includes the CTT enable signal generation circuit 460.

The CTT enable signal generation circuit 460 generates a CTT enable signal CTT_EN in accordance with a command latch enable signal CLE and an address latch enable signal ALE. The CTT enable signal generation circuit 460 supplies the CTT enable signal CTT_EN to the termination circuit 410.

The termination circuit 410 switches the termination system in accordance with a POD enable signal POD_EN from the POD enable signal generation circuit 420 and the CTT enable signal CTT_EN from the CTT enable signal generation circuit 460. In accordance with the termination system, the termination circuit 410 adjusts a voltage from an input/output pin 10, and supplies it to the first input terminal of an input buffer 440.

More specifically, as shown in FIG. 10, the termination circuit 410 includes a CTT circuit 413 and a POD circuit 414.

The CTT circuit 413 includes an NMOS transistor 413A, a PMOS transistor 413C, and resistors 413B and 413D. The POD circuit 414 includes a PMOS transistor 414A, the PMOS transistor 413C, and a resistor 414B, and the resistor 413D. The PMOS transistor 413C and the resistor 413D are shared by the CTT circuit 413 and the POD circuit 414.

The NMOS transistor 413A has the first terminal electrically connected to a ground voltage VSSq and the second terminal electrically connected to the first terminal of the resistor 413B. The second terminal of the resistor 413B is electrically connected to the input/output pin 10 and the first input terminal of the input buffer 440. The CTT enable signal CTT_EN is supplied from the CTT enable signal generation circuit 460 to the control terminal of the NMOS transistor 413A.

The PMOS transistor 414A has the first terminal electrically connected to a power supply voltage VCCq, and the second terminal electrically connected to the first terminal of the resistor 414B. The second terminal of the resistor 414B is electrically connected to the input/output pin 10 and the first input terminal of the input buffer 440. A POD enable inverted signal /POD_EN is supplied from the POD enable signal generation circuit 420 to the control terminal of the PMOS transistor 414A.

The PMOS transistor 413C has the first terminal electrically connected to the power supply voltage VCCq, and the second terminal electrically connected to the first terminal of the resistor 413D. The second terminal of the resistor 413D is electrically connected to the input/output pin 10 and the first input terminal of the input buffer 440. The control terminal of the PMOS transistor 413C is supplied with the POD enable inverted signal /POD_EN from the POD enable signal generation circuit 420 or the CTT enable signal CTT_EN from the CTT enable signal generation circuit 460.

Although it is desirable that the resistors 413B, 413D, and 414B desirably have almost equal resistances, the present invention is not limited to this.

When the termination circuit 410 functions as the POD system, the POD enable inverted signal /POD_EN at "L"

level is supplied to the control terminals of the PMOS transistors 414A and 413C. This turns on the PMOS transistors 414A and 413C. The on resistances of the PMOS transistors 414A and 413C and the resistors 414B and 413D raise the voltage VSSq from the input/output pin 10 to a voltage VSSq+α. That is, as indicated by a broken line in FIG. 11, the termination circuit 410 adjusts the voltage amplitude from the input/output pin 10 within the range from the voltage VSSq+α to the voltage VCCq by the load resistance of the on resistances of the PMOS transistors 414A and 413C and the resistors 414B and 413D. Consequently, the termination circuit 410 supplies, to the first input terminal of the input buffer 440, a voltage having an amplitude of the voltage VSSq+α to the voltage VCCq.

When the termination circuit 410 functions as the CTT system, a CTT enable inverted signal /CTT_EN at "L" level is supplied to the control terminal of the PMOS transistor 413C, and the CTT enable signal CTT_EN at "H" level is supplied to the control terminal of the NMOS transistor 413A. This turns on the PMOS transistor 413C and the NMOS transistor 413A. The on resistance of the PMOS transistor 413C and the resistor 413D raise the voltage VSSq from the input/output pin 10 to the voltage VSSq+α. On the other hand, the on resistance of the NMOS transistor 413A and the resistor 413B lower the voltage VCCq from the input/output pin 10 to a voltage VCCq-α. That is, as indicated by a solid line in FIG. 11, the termination circuit 410 adjusts the voltage amplitude from the input/output pin 10 within the range from the voltage VSSq+α to the voltage VCCq-α by the load resistance of the on resistances of the PMOS transistor 413C and NMOS transistor 413A and the resistors 413B and 413D. Consequently, the termination circuit 410 supplies, to the first input terminal of the input buffer 440, a voltage having an amplitude of the voltage VSSq+α to the voltage VCCq-α.

As shown in FIG. 11, when the termination circuit 410 functions as the POD system, a reference voltage generation circuit 430 supplies a reference voltage VREFq (>(VCCq+VSSq)/2) as an intermediate value between the voltage VSSq+α and the voltage VCCq. On the other hand, when the termination circuit 410 functions as the CTT system, the reference voltage generation circuit 430 supplies the reference voltage VREFq (=(VCCq+VSSq)/2) as an intermediate value between the voltage VSSq and the voltage VCCq.

[Examples of Operations of Controller and NAND Memory of Third Embodiment]

Figure 12:
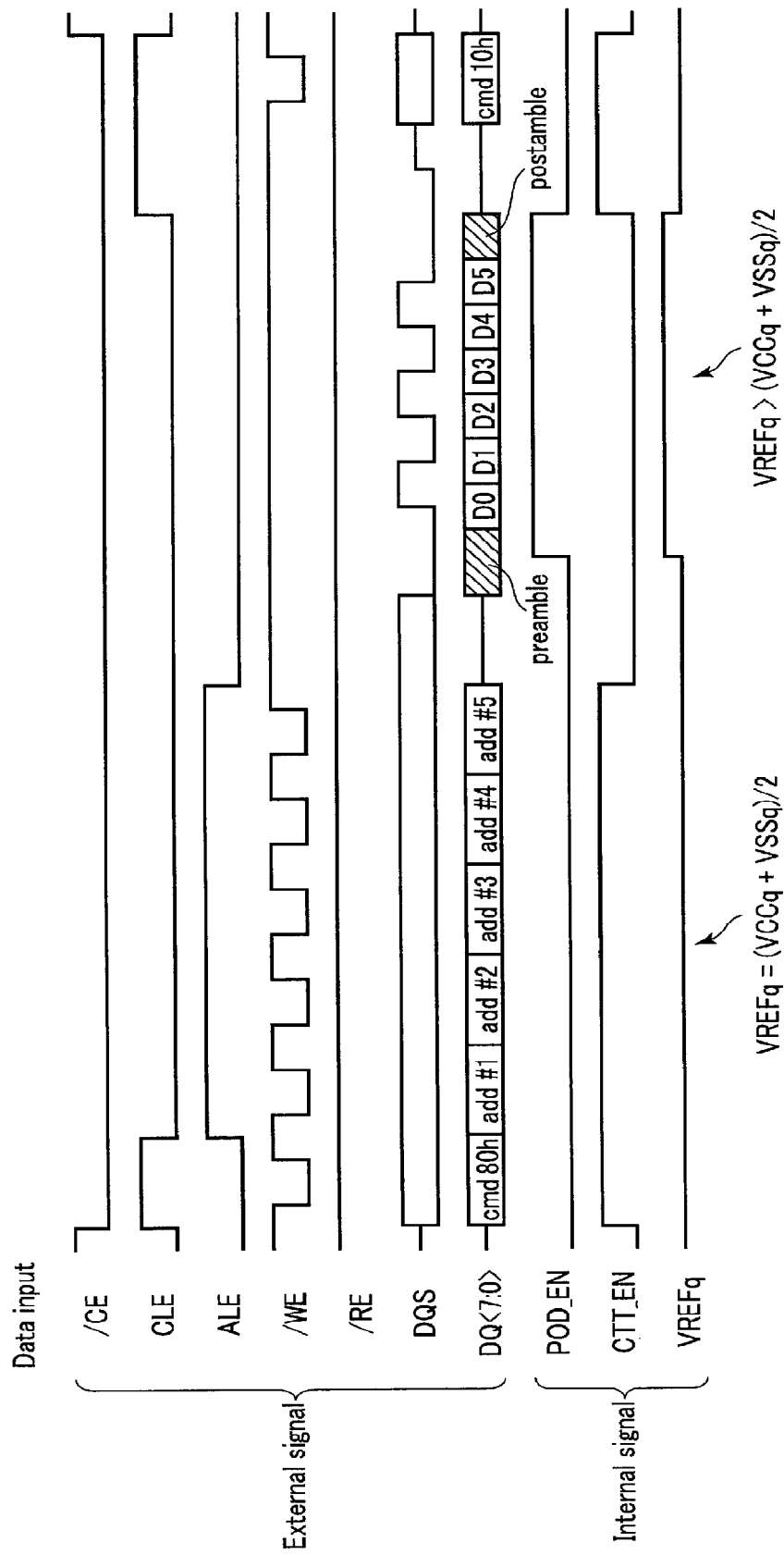
FIG. 12 is a timing chart showing various signals in the semiconductor memory device according to the third embodiment.

FIG. 12 is a timing chart showing various signals in the semiconductor memory device 100 according to the third embodiment. Referring to FIG. 12, the POD enable signal POD_EN and the CTT enable signal CTT_EN are internal signals generated in the NAND memory 400.

As shown in FIG. 12, a chip enable inverted signal /CE is set at "L" level to select a chip. In addition, the command latch enable signal CLE is set at "H" level. During this time, a write enable inverted signal /WE is used as a clock to transfer a command cmd80h (for example, a write command) from the controller 300 to the NAND memory 400.

Subsequently, the command latch enable signal CLE is set at "L" level, and an address latch enable signal ALE is set at "H" level. During this time, the write enable inverted signal /WE is used as a clock to transfer addresses add#1 to add#5 from the controller 300 to the NAND memory 400.

During this time, a data strobe signal DQS is set at "H" or "L" level. In addition, a read enable inverted signal /RE is set at "H" level.

In accordance with "H" level of the command latch enable signal CLE and address latch enable signal ALE, the NAND memory 400 (CTT enable signal generation circuit 460) sets the CTT enable signal CTT_EN at "H" level. Consequently, when transferring the command cmd80h and the addresses add#1 to add#5 to the NAND memory 400, the CTT enable signal generation circuit 460 generates the CTT enable signal CTT_EN at "H" level (the CTT enable inverted signal /CTT_EN at "L" level). This turns on the PMOS transistor 413C and NMOS transistor 413A in the termination circuit 410. That is, when transferring the command cmd80h and the addresses add#1 to add#5, the termination circuit 410 functions as the CTT system. At this time, the reference voltage generation circuit 430 generates the reference voltage VREFq (=(VCCq+VSSq)/2).

Note that the operation of the POD enable signal generation circuit 420 is the same as in the first embodiment and a description thereof will be omitted.

[Effects in Third Embodiment]

In the aforementioned third embodiment, the POD enable signal generation circuit 420 and the CTT enable signal generation circuit 460 are provided. When transferring data, commands, and addresses from the controller 300 to the NAND memory 400 via the input/output pin 10, the termination system of the termination circuit 410 is switched in accordance with the POD enable signal. More specifically, the termination circuit 410 serves as the POD system when transferring data, and serves as the CTT system when transferring commands and addresses. This can perform a transfer operation at high speed in transferring commands and addresses, and perform a transfer operation at high speed while suppressing an increase in power consumption in transferring data.

In this case, similarly to a case in the first embodiment in which the termination circuit 410 is switched between the POD system and the open terminal, an intermediate value (the intermediate value of the voltage amplitude) between "H" level and "L" level is different between the POD system and the CTT system in the third embodiment. Therefore, it is impossible to set the same reference voltage VREFq for the POD system and CTT system which have the different intermediate values.

To cope with this, the reference voltage generation circuit 430 is provided in the third embodiment, similarly to the first embodiment. The reference voltage generation circuit 430 generates the reference voltage VREFq, as needed, in accordance with the POD enable signal. This makes it possible to generate different reference voltages VREFq for the POD system and CTT system, thereby implementing the above-described switching of the system of the termination circuit 410.

Note that the POD circuit 414 may operate by only the PMOS transistor 414A and the resistor 414B. In this case, the resistor 414B desirably has a resistance about half that of the resistor 413B or 413D.

Fourth Embodiment

A semiconductor memory device according to the fourth embodiment will be described below with reference to FIGS. 13, 14, and 15.

In the third embodiment, the POD circuit 414 on the VCCq side is provided. To the contrary, the fourth embodiment is a modification of the third embodiment, in which a POD circuit 416 on the VSSq side is provided.

The fourth embodiment will be described in detail below. Note that in the fourth embodiment, a description of the same points as in the third embodiment will be omitted, and different points will mainly be explained.

[Examples of Arrangements of Controller and NAND Memory of Fourth Embodiment]

FIG. 13 is a circuit diagram showing a termination circuit 410 in the semiconductor memory device according to the fourth embodiment. FIG. 14 is a waveform chart showing a voltage supplied by the termination circuit 410 in the semiconductor memory device according to the fourth embodiment. FIG. 15 is a timing chart showing various signals in a semiconductor memory device 100 according to the fourth embodiment.

As shown in FIG. 13, in the fourth embodiment, the difference from the third embodiment is that the POD circuit 416 on the VSSq side is provided.

The termination circuit 410 includes a CTT circuit 415 and the POD circuit 416.

The CTT circuit 415 includes an NMOS transistor 415A, a PMOS transistor 415C, and resistors 4153 and 415D. The POD circuit 416 includes an NMOS transistor 416A, the NMOS transistor 415A, a resistor 416B, and the resistor 415B. The NMOS transistor 415A and the resistor 415B are shared by the CTT circuit 415 and the POD circuit 416.

The NMOS transistor 415A has the first terminal electrically connected to a ground voltage VSSq and the second terminal electrically connected to the first terminal of the resistor 415B. The second terminal of the resistor 415B is electrically connected to an input/output pin 10 and the first input terminal of an input buffer 440. The control terminal of the NMOS transistor 415A is supplied with a CTT enable signal CTT_EN from a CTT enable signal generation circuit 460 or a POD enable signal POD_EN from a POD enable signal generation circuit 420.

The NMOS transistor 416A has the first terminal electrically connected to the ground voltage VSSq and the second terminal electrically connected to the first terminal of the resistor 416B. The second terminal of the resistor 416E is electrically connected to the input/output pin 10 and the first input terminal of the input buffer 440. The POD enable signal POD_EN is supplied from the POD enable signal generation circuit 420 to the control terminal of the NMOS transistor 416A.

The PMOS transistor 415C has the first terminal electrically connected to a power supply voltage VCCq and the second terminal electrically connected to the first terminal of the resistor 415D. The second terminal of the resistor 415D is electrically connected to the input/output pin 10 and the first input terminal of the input buffer 440. A CTT enable inverted signal /CTT_EN is supplied from the CTT enable signal generation circuit 460 to the control terminal of the PMOS transistor 415C.

When the termination circuit 410 functions as the POD system, the POD enable signal POD_EN at "H" level is supplied to the control terminals of the NMOS transistors 416A and 415A. This turns on the NMOS transistors 416A and 415A. The on resistances of the NMOS transistors 416A and 415A and the resistors 416B and 415B lower a voltage VCCq from the input/output pin 10 to a voltage VCCq-α. That is, as indicated by a broken line in FIG. 14, the termination circuit 410 adjusts the voltage amplitude from the input/output pin 10 within the range from the voltage VSSq to a voltage VCCq-α by the load resistance of the on resistances of the NMOS transistors 416A and 415A and the resistors 416B and 415B. Consequently, the termination circuit 410 supplies, to the first input terminal of the input buffer 440, a voltage having an amplitude of the voltage VSSq to the voltage VCCq-α.

When the termination circuit 410 functions as the CTT system, the CTT enable inverted signal /CTT_EN at "L" level is supplied to the control terminal of the PMOS transistor 415C, and the CTT enable signal CTT_EN at "H" level is supplied to the control terminal of the NMOS transistor 415A. This turns on the PMOS transistor 415C and the NMOS transistor 415A. The on resistance of the PMOS transistor 415C and the resistor 415D raise the voltage VSSq from the input/output pin 10 to the voltage VSSq+α. On the other hand, the on resistance of the NMOS transistor 415A and the resistor 415B lower the voltage VCCq from the input/output pin 10 to the voltage VCCq-α. That is, as indicated by a solid line in FIG. 14, the termination circuit 410 adjusts the voltage amplitude from the input/output pin 10 within the range from the voltage VSSq+α to the voltage VCCq-α by the load resistance of the on resistances of the PMOS transistor 415C and NMOS transistor 415A and the resistors 415B and 415D. Consequently, the termination circuit 410 supplies, to the first input terminal of the input buffer 440, a voltage having an amplitude of the voltage VSSq+α to the voltage VCCq-α.

Figure 14:
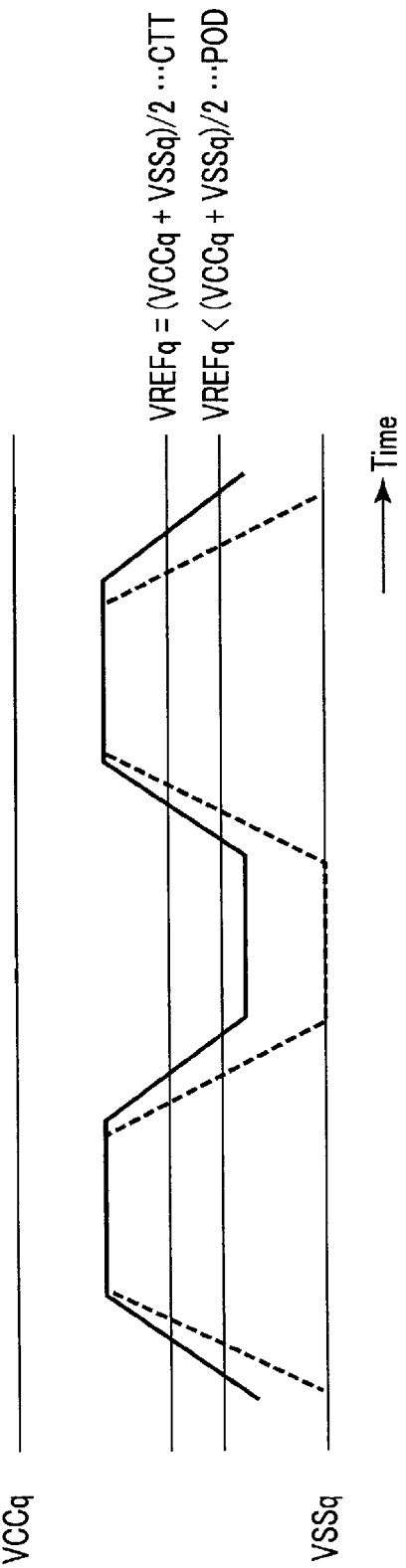
FIG. 14 is a waveform chart showing a voltage supplied by the termination circuit in the semiconductor memory device according to the fourth embodiment.

In addition, as shown in FIG. 14, when the termination circuit 410 functions as the POD system, a reference voltage generation circuit 430 supplies a reference voltage VREFq (<(VCCq+VSSq)/2) as an intermediate value between the voltage VSSq and the voltage VCCq-α. On the other hand, when the termination circuit 410 functions as the CTT system, the reference voltage generation circuit 430 supplies the reference voltage VREFq (=(VCCq+VSSq)/2) as an intermediate value between the voltage VSSq+α and the voltage VCCq-α.

Figure 15:
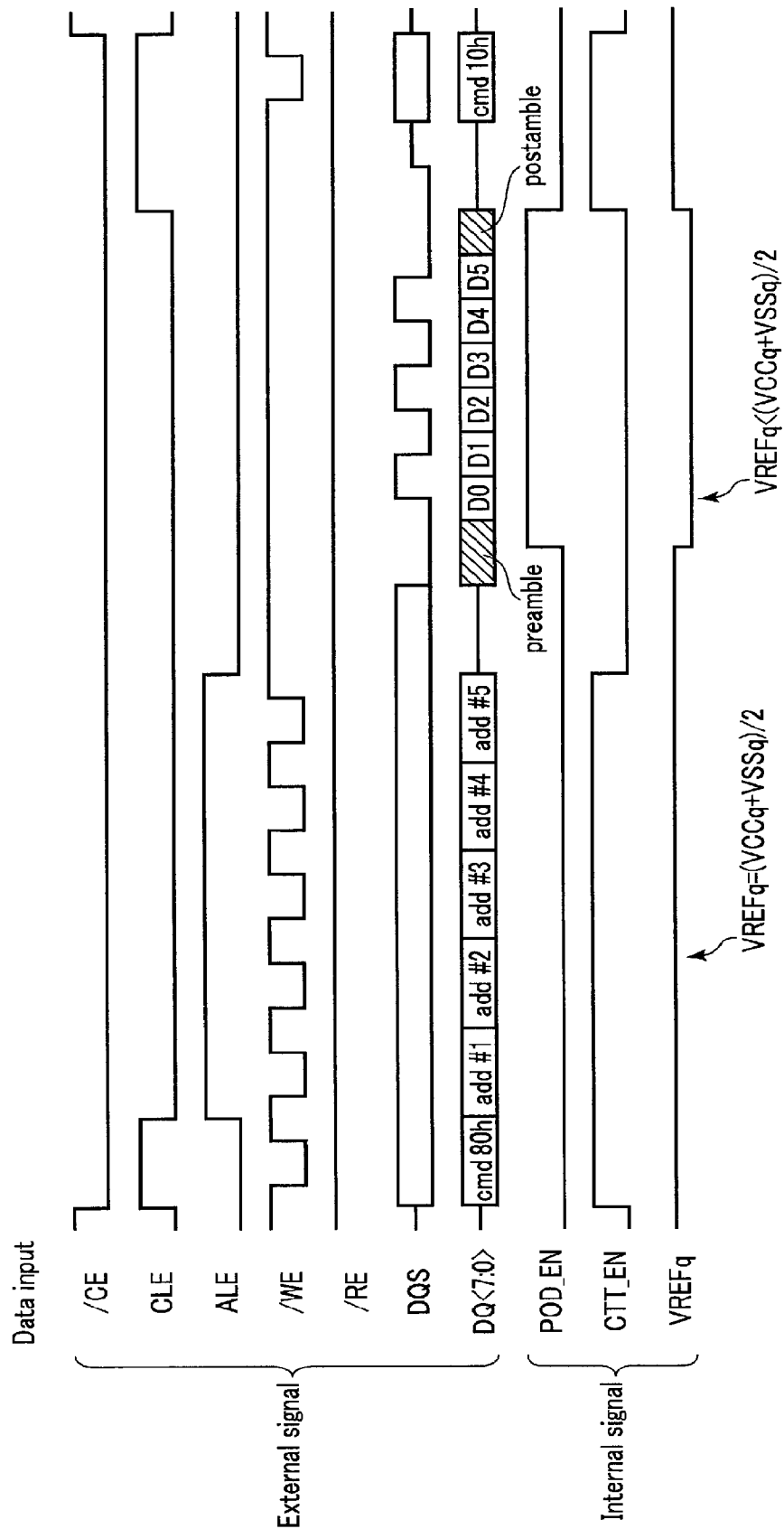
FIG. 15 is a timing chart showing various signals in the semiconductor memory device according to the fourth embodiment.

Furthermore, as shown in FIG. 15, when transferring data D0 to D5, the termination circuit 410 functions as the POD system. At this time, the reference voltage generation circuit 430 generates the reference voltage VREFq (<(VCCq+VSSq)/2).

[Effects in Fourth Embodiment]

In the aforementioned fourth embodiment, the termination circuit 410 includes the POD circuit 416 on the VSSq side. This makes it possible to obtain the same effects as in the third embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a memory including a memory cell array; and
an input/output pin configured to transfer data, a command, and an address from an external to the memory,
wherein the memory includes a termination circuit provided between the input/output pin and the memory cell array, and configured to supply a first voltage having a first amplitude in a first transfer mode and supply a second voltage having a second amplitude in a second transfer mode, a first intermediate value of the first amplitude being different from a second intermediate value of the second amplitude.

2. The device of claim 1, wherein
the termination circuit includes
a first transistor having a first terminal electrically connected to a power supply voltage, and
a first resistor having a first terminal electrically connected to a second terminal of the first transistor and a second terminal electrically connected to the input/output pin.

3. The device of claim 2, wherein
the memory further includes a first signal generation circuit configured to supply a first signal for turning on the first transistor to a control terminal of the first transistor in the second transfer mode.

4. The device of claim 3, wherein
the first signal generation circuit supplies the first signal in accordance with a chip enable signal, a command latch enable signal, an address latch enable signal, a write enable signal, a read enable signal, and a data strobe signal.

5. The device of claim 1, wherein
the command and the address are transferred in the first transfer mode, and the data is transferred in the second transfer mode.

6. The device of claim 1, wherein
the memory further includes
a voltage generation circuit configured to generate a third voltage equal to the first intermediate value in the first transfer mode, and generate a fourth voltage equal to the second intermediate value in the second transfer mode, and
an input buffer configured to compare the first voltage with the third voltage in the first transfer mode, and compare the second voltage with the fourth voltage in the second transfer mode.

7. The device of claim 1, wherein
the termination circuit includes
a first transistor having a first terminal electrically connected to a ground voltage, and
a first resistor having a first terminal electrically connected to a second terminal of the first transistor and a second terminal electrically connected to the input/output pin.

8. The device of claim 7, wherein
the memory further includes a first signal generation circuit configured to supply a first signal for turning on the first transistor to a control terminal of the first transistor in the second transfer mode.

9. The device of claim 8, wherein
the first signal generation circuit supplies the first signal in accordance with a chip enable signal, a command latch enable signal, an address latch enable signal, a write enable signal, a read enable signal, and a data strobe signal.

10. The device of claim 1, wherein
the termination circuit includes
a first transistor having a first terminal electrically connected to a power supply voltage,
a first resistor having a first terminal electrically connected to a second terminal of the first transistor and a second terminal electrically connected to the input/output pin,
a second transistor having a first terminal electrically connected to the power supply voltage,
a second resistor having a first terminal electrically connected to a second terminal of the second transistor and a second terminal electrically connected to the input/output pin,
a third transistor having a first terminal electrically connected to a ground voltage, and
a third resistor having a first terminal electrically connected to a second terminal of the third transistor and a second terminal electrically connected to the input/output pin.

11. The device of claim 10, wherein
the memory further includes
a first signal generation circuit configured to supply a first signal for turning on the first transistor and the second transistor to a control terminal of the first transistor and a control terminal of the second transistor in the second transfer mode, and
a second signal generation circuit configured to supply a second signal for turning on the first transistor and the third transistor to the control terminal of the first transistor and a control terminal of the third transistor in the first transfer mode.

12. The device of claim 11, wherein
the first signal generation circuit supplies the first signal in accordance with a chip enable signal, a command latch enable signal, an address latch enable signal, a write enable signal, a read enable signal, and a data strobe signal.

13. The device of claim 11, wherein
the second signal generation circuit supplies the second signal in accordance with a command latch enable signal and an address latch enable signal.

14. The device of claim 1, wherein
the termination circuit includes
a first transistor having a first terminal electrically connected to a ground voltage,
a first resistor having a first terminal electrically connected to a second terminal of the first transistor and a second terminal electrically connected to the input/output pin,
a second transistor having a first terminal electrically connected to the ground voltage,
a second resistor having a first terminal electrically connected to a second terminal of the second transistor and a second terminal electrically connected to the input/output pin,
a third transistor having a first terminal electrically connected to a power supply voltage, and
a third resistor having a first terminal electrically connected to a second terminal of the third transistor and a second terminal electrically connected to the input/output pin.

15. The device of claim 14, wherein
the memory further includes
a first signal generation circuit configured to supply a first signal for turning on the first transistor and the second transistor to a control terminal of the first transistor and a control terminal of the second transistor in the second transfer mode, and
a second signal generation circuit configured to supply a second signal for turning on the first transistor and the third transistor to the control terminal of the first transistor and a control terminal of the third transistor in the first transfer mode.

16. The device of claim 15, wherein
the first signal generation circuit supplies the first signal in accordance with a chip enable signal, a command latch enable signal, an address latch enable signal, a write enable signal, a read enable signal, and a data strobe signal.

17. The device of claim 15, wherein
the second signal generation circuit supplies the second signal in accordance with a command latch enable signal and an address latch enable signal.

18. The device of claim 1, further comprising:
a controller configured to control the memory and transfer the data, command, and address to the memory via the input/output pin.

* * * * *